(12) United States Patent
Ranjan et al.

(10) Patent No.: US 9,220,184 B2
(45) Date of Patent: Dec. 22, 2015

(54) ADVANCED COOLING FOR POWER MODULE SWITCHES

(71) Applicant: Hamilton Sundstrand Corporation, Windsor Locks, CT (US)

(72) Inventors: Ram Ranjan, New Britain, CT (US); Matthew Robert Pearson, Hartford, CT (US); Shashank Krishnamurthy, Rocky Hill, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 294 days.

(21) Appl. No.: 13/836,395

(22) Filed: Mar. 15, 2013

(65) Prior Publication Data

US 2014/0268572 A1 Sep. 18, 2014

(51) Int. Cl.
*H05K 7/20* (2006.01)
*H01L 23/427* (2006.01)

(52) U.S. Cl.
CPC .......... *H05K 7/20336* (2013.01); *H01L 23/427* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,732,918 B2 * | 6/2010 | Dangelo et al. | 257/722 |
| 7,875,900 B2 * | 1/2011 | Meyer et al. | 257/99 |
| 7,913,748 B2 * | 3/2011 | Lin et al. | 165/104.26 |
| 7,965,511 B2 * | 6/2011 | Refai-Ahmed | 361/700 |
| 8,159,821 B2 | 4/2012 | Tan et al. | |
| 8,335,083 B2 | 12/2012 | Yang et al. | |
| 2003/0183368 A1 | 10/2003 | Paradis et al. | |
| 2005/0213301 A1 | 9/2005 | Prasher | |
| 2007/0090737 A1 * | 4/2007 | Hu et al. | 313/11 |
| 2007/0097737 A1 * | 5/2007 | Asano et al. | 365/163 |
| 2008/0128116 A1 * | 6/2008 | Dangelo et al. | 165/104.21 |
| 2008/0174963 A1 * | 7/2008 | Chang et al. | 361/700 |
| 2008/0277779 A1 | 11/2008 | Gupta et al. | |
| 2009/0140417 A1 * | 6/2009 | Refai-Ahmed | 257/707 |
| 2009/0294117 A1 * | 12/2009 | Hodes et al. | 165/287 |
| 2011/0176276 A1 | 7/2011 | Sarraf et al. | |
| 2012/0205706 A1 | 8/2012 | Shuja | |
| 2014/0247556 A1 * | 9/2014 | Eid et al. | 361/700 |

FOREIGN PATENT DOCUMENTS

JP   H10209356 A   8/1998

OTHER PUBLICATIONS

Extended European Search Report from EP Application Serial No. 14159180.0, Dated Apr. 21, 2015, 7 pages.

\* cited by examiner

*Primary Examiner* — Gregory Thompson
(74) *Attorney, Agent, or Firm* — Kinney & Lange, P.A.

(57) ABSTRACT

A system includes an electronic device, a heat spreader with a vapor chamber attached to a bottom end of the electronic device, so that heat flows from the electronic device to the heat spreader, and a heat sink with microchannels running through it attached to a bottom end of the heat spreader, so that heat from the heat spreader flows through the heat sink and to an ambient. A method for cooling a device includes transferring heat generated by a device through a conductivity layer, spreading the heat through a heat spreader, transferring the heat from the heat spreader to a heat sink that contains microchannels, and releasing the heat from the heat sink into an ambient.

20 Claims, 6 Drawing Sheets

ADVANCED COOLING FOR POWER MODULE SWITCHES

BACKGROUND

The present invention relates to cooling systems, and in particular, to a cooling system for use with power module switches.

As technology is advanced, increased power generation and distribution is required to support the technology. This is especially true when wide bandgap semiconductor devices are being used. Wide bandgap devices can provide high power at small sizes. This is beneficial for applications where space is limited and weight needs to be kept at a minimum. While wide bandgap devices can maximize power generation in small sizes, one problem that exists is that they operate at very high heat fluxes. The high heat produced by the wide bandgap devices can cause problems, as exposure to high heat can limit the life and durability of the components that are located by and around the wide bandgap devices.

To transfer heat away from the high bandgap devices, cooling systems exist that can be attached to the high bandgap devices to transfer heat away from the high bandgap devices and into an ambient. The cooling systems currently being used include systems with multiple layers of materials stacked up through which the heat can be transferred. One limitation of the currently used cooling systems is the amount of thermal resistance that exists between the layers of materials that are used. Another limitation includes the differences in coefficients of thermal expansion that exist between the layers. The high mismatch in coefficients of thermal expansion of the layers limits the life as the device, as the mismatch causes thermo-mechanical fatigue which ultimately limits the life of the system.

SUMMARY

According to the present invention, a system includes an electronic device, a heat spreader with a vapor chamber attached to a bottom end of the electronic device, so that heat flows from the electronic device to the heat spreader, and a heat sink with microchannels running through it attached to a bottom end of the heat spreader, so that heat from the heat spreader flows through the heat sink and to an ambient.

A method for cooling a device includes transferring heat generated by a device through a conductivity layer, spreading the heat through a heat spreader, transferring the heat from the heat spreader to a heat sink that contains microchannels, and releasing the heat from the heat sink into an ambient.

DETAILED DESCRIPTION

In general, the present invention relates to an advanced cooling system for power module switches. The advanced cooling system includes a heat spreader attached to a heat sink. An electronic device can be attached to the cooling system and heat from the electronic device can be transferred through the cooling system to an ambient. The heat spreader includes a vapor chamber that increases the amount of heat that can be transferred from the device to the heat sink under a given temperature differential by utilizing a phase change working fluid. The heat sink includes a plurality of microchannels running through it that offer very high heat transfer coefficients due to area enhancement and a heat transfer substance running through the microchannels.

Figure 1A:
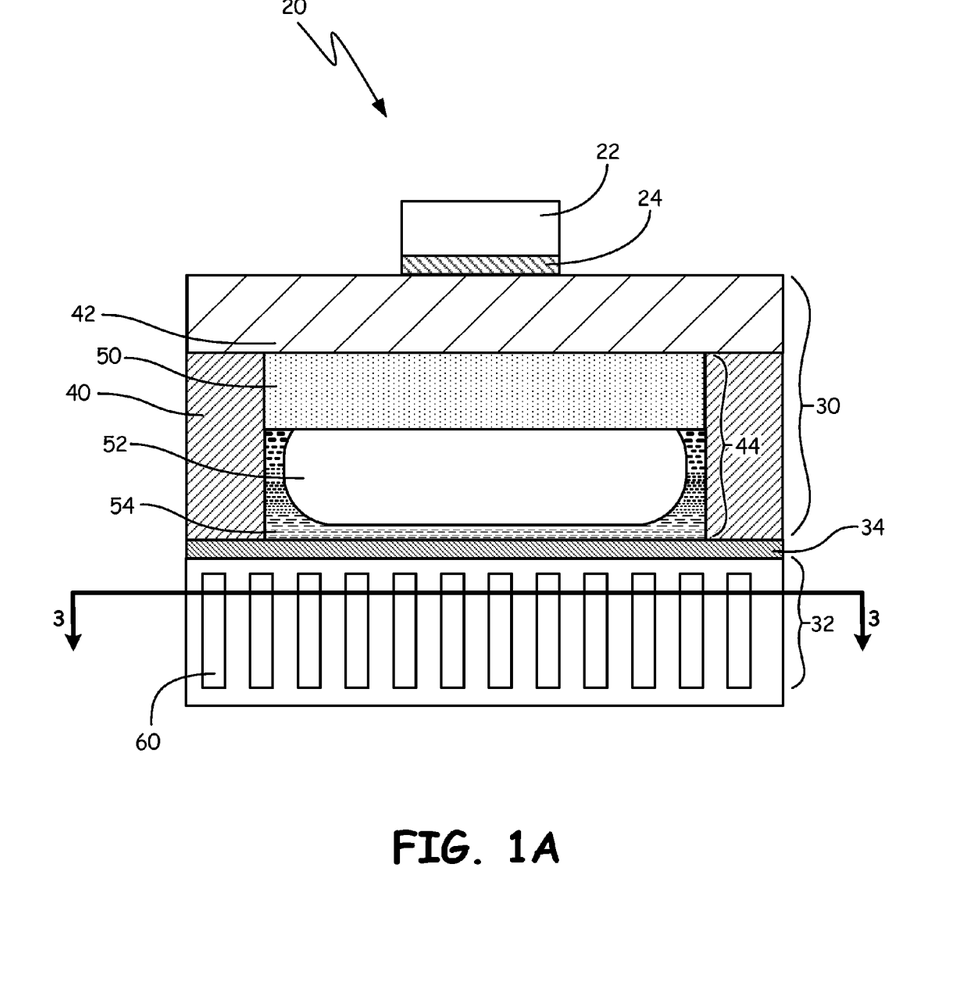
FIG. 1A is a front cross-sectional view of a cooling system according to the present invention.
Figure 1B:
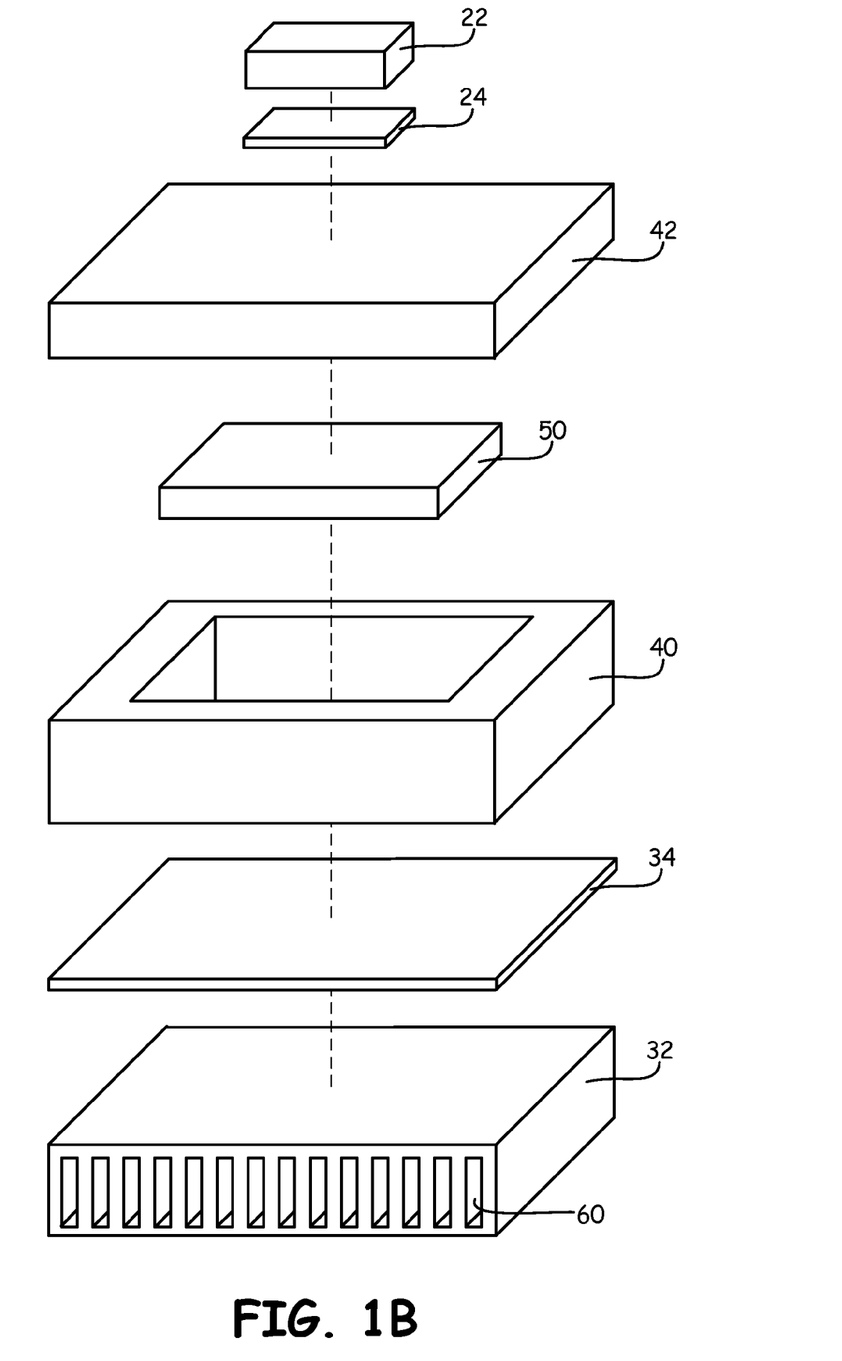
FIG. 1B is an exploded view of the cooling system seen in FIG. 1A.

FIG. 1A is a front cross-sectional view of cooling system 20 according to the present invention. FIG. 1B is an exploded view of cooling system 20 seen in FIG. 1A. Cooling system 20 includes electronic device 22, interface layer 24, heat spreader 30, heat sink 32, and connecting layer 34. Heat spreader 30 includes frame 40, conductivity layer 42, and vapor chamber 44. Vapor chamber 44 includes wick structure layer 50, vapor cavity 52, and working fluid 54. Heat sink 32 includes microchannels 60.

As seen in FIG. 1A, a bottom side of electronic device 22 is attached to a top side of heat spreader 30 with interface layer 24. In the embodiment shown, electronic device 22 is a wide bandgap device constructed out of a wide bandgap semiconductor, such as silicon carbide or gallium nitride. In alternate embodiments, electronic device 22 can be any type of electronic device and can be made out of any material that is capable of being used as an electronic device. Interface layer 24 can be any material that is capable of holding electronic device 22 on heat spreader 30, for instance a metal-based material such as sintered silver. Further, interface layer 24 can be placed between electronic device 22 and heat spreader 30 with any suitable manufacturing process, including soldering, sintering, or brazing. In the embodiment shown, interface layer 24 is a soldered layer that attaches electronic device 22 to heat spreader 30.

Heat spreader 30 includes conductivity layer 42, frame 40, and vapor chamber 44, including wick structure layer 50, vapor cavity 52, and working fluid 54. A bottom side of conductivity layer 42 is connected to a top side of frame 40 and wick structure layer 50. Conductivity layer 42 is made out of copper-molybdenum-copper layers in the embodiment shown. In alternate embodiments, conductivity layer 42 can be made out of any material that is capable of transferring heat from electronic device 22 to vapor chamber 44. Conductivity layer 42 is used to spread the heat that is entering cooling system 20 from electronic device 22. Conductivity layer 42 can be further used for electrical conduction with electronic device 22.

A top side of frame 40 is connected to a bottom side of conductivity layer 42. A bottom side of frame 40 is connected to connecting layer 34 to connect heat spreader 30 to heat sink 32. Frame 40 houses vapor chamber 44, including wick structure layer 50, vapor cavity 52, and working fluid 54. In the embodiment shown, frame 40 is constructed out of copper and is brazed to conductivity layer 42 and connecting layer 34. In alternate embodiments, frame 40 can be made out of any suitable material and can be manufactured with any suitable manufacturing process.

Vapor chamber 44 is held inside frame 40 underneath conductivity layer 42. Vapor chamber 44 includes wick structure layer 50 held inside frame 40 at a top end of frame 40. Wick structure layer 50 is a porous material that is capable of wicking and holding working fluid 54 in both liquid form and vapor form. Wick structure layer 50 is made out of sintered copper particles in the embodiment shown, but can be made out of any material that is capable of wicking fluid, including copper mesh. A top side of wick structure layer 50 is connected to a bottom side of conductivity layer 42 for heat conduction. Vapor cavity 52 is held inside frame 40 at a bottom end of frame 40. Vapor cavity 52 is an empty space that is capable of containing working fluid 54 in both liquid form and vapor form. Working fluid 54 is contained in vapor chamber 44, including both wick structure layer 50 and vapor cavity 52. Working fluid 54 is a two-phase change material that will vaporize when heated and condense when cooled. Working fluid 54 moves between wick structure layer 50 and vapor cavity 52 to transfer heat from conductivity layer 42 through vapor chamber 44 to heat sink 32.

A bottom side of heat spreader 30 is attached to a top side of heat sink 32 with connecting layer 34. Connecting layer 34 can be any material that is capable of holding heat spreader 30 and heat sink 32 together. Further, connecting layer 34 can be placed between heat spreader 30 and heat sink 32 with any suitable manufacturing process, including soldering, sintering, or brazing. In the embodiment shown, connecting layer 34 is a copper layer that is direct-bonded to heat sink 32 and brazed to heat spreader 30.

Heat sink 32 is made out of a ceramic material, such as aluminum nitride or silicon nitride, in the embodiment shown. In alternate embodiments, heat sink 32 can be constructed out of any suitable material. Heat sink 32 transfers heat from heat spreader 30 to an ambient. Heat sink 32 includes a plurality of microchannels 60. Microchannels 60 run from a first side of heat sink 32 to a second side of heat sink 32. Microchannels 60 are capable of containing a heat transfer substance to facilitate heat transfer through heat sink 32. The heat transfer substance that is held in microchannels 60 can include a two-phase change substance, such as a refrigerant, that is capable of transforming between a vapor when heated and a liquid when cooled. The heat transfer substance can also include a single-phase liquid or vapor fluid that flows through microchannels 60. The heat transfer substance can be moved through microchannels 60 with a variety of processes, including a fan, a liquid pump, or other technologies that produce fluid motion, such as electro-hydro-dynamics. To pump the substance through microchannels 60, the first side of heat sink 32 is connected to a fluid supply and the second side of heat sink 32 is connected to a fluid return, which can include a tube, a drain, or any other fluid return. The heat transfer substance that is passed through each microchannel 60 picks up the heat that is transferred through heat sink 32 and transfers it out of cooling system 20.

In the embodiment shown in FIG. 1A, conductivity layer 42 and heat sink 32 are constructed out of materials that have a similar coefficient of thermal expansion as that of electronic device 22. This will reduce the coefficient of thermal expansion mismatch between electronic device 22, heat spreader 30, and heat sink 32, which will reduce the thermo-mechanical stresses on cooling system 20. The reduction in thermo-mechanical stresses and thermo-mechanical fatigue experienced by cooling system 20 will improve the life, effectiveness, and reliability of cooling system 20.

Cooling system 20 as seen in FIG. 1A is an improvement over the prior art, as it reduces the number of interface layers required to connect the different layers of the system. This reduction in interface layers will reduce thermal resistance through the system and will yield a more reliable cooling system. The reduction in interface layers also makes cooling system 20 easier to manufacture and reduces the cost of manufacturing cooling system 20.

Cooling system 20 is advantageous, as it is able to handle higher heat generating electronic devices, such as wide band-gap devices. Using cooling system 20 in power module systems provides greater engineering margins by allowing more heat to be transferred with a given temperature difference. These engineering margins can be taken up with higher heat generating electronic devices, reduced device operating temperatures, and/or increased coolant temperatures. Using higher heat generating electronic devices is advantageous, as these electronic devices are typically smaller in size and weight. Reducing the size and weight of electronic devices is beneficial in applications where space and weight are limited. Reduced device operating temperature can improve the lifetime of the device. Increased coolant temperature can allow the device to operate in a wider range of applications and environments. Overall, cooling system 20 reduces the thermal resistances seen in prior art applications and increases the reliability and effectiveness of cooling system 20.

Currently used power module packages attach an electronic device to a power module system that includes a ceramic layer between two direct bonded copper layers that are attached to a copper thermal spreader and a cold plate. These power module packages consist of materials with significantly different coefficients of thermal expansion, with a mismatch up to 200%. The present application reduces the coefficient of thermal expansion mismatch to 100%, resulting in a significant power module life increase. Further, the present application reduces the junction-to-ambient thermal resistance (or temperature drop) by 50% over currently used packages, thus improving the maximum heat flux of power module switches by greater than two times over currently used packages. The power module reliability will also be enhanced by a factor greater than four times due to a two times reduction in thermal resistance and a two times improvement in coefficient of thermal expansion match between an electronic chip and its carrier.

Figure 2:
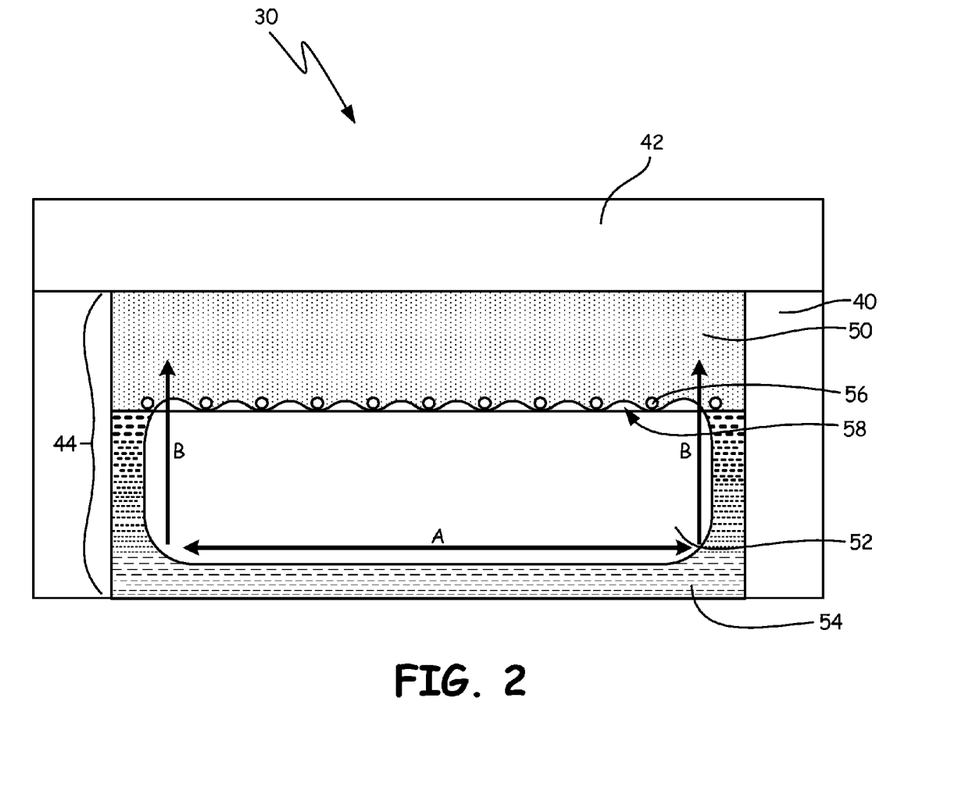
FIG. 2 is a front cross-sectional view of a heat spreader portion of the cooling system seen in FIG. 1A.

FIG. 2 is a front cross-sectional view of heat spreader 30 of cooling system 20. Heat spreader 30 includes frame 40, conductivity layer 42, and vapor chamber 44. Vapor chamber 44 includes wick structure layer 50, vapor cavity 52, and working fluid 54. Wick structure layer 50 includes sintered particles 56 and liquid meniscus curvature 58.

Conductivity layer 42 is held on a top end of heat spreader 30. A top side of frame 40 is connected to a bottom side of conductivity layer 42. Frame 40 holds vapor chamber 44, including wick structure layer 50, vapor cavity 52, and working fluid 54. Conductivity layer 42 can be attached to an electronic device, and will spread heat from the electronic device through conductivity layer 42. This heat will then transfer to vapor chamber 44. Vapor chamber 44 can transfer an increased amount of heat through heat spreader 30 due to the use of working fluid 54. Vapor chamber 44 will further spread the heat coming from the electronic device through cooling system 20.

Vapor chamber 44 includes wick structure layer 50 at a top end and vapor cavity 52 at a bottom end. Wick structure layer 50 is sintered copper particles in the embodiment shown, but can be made out of any material that is capable of wicking working fluid 54. In FIG. 2, sintered particles 56 are shown running along a bottom end of wick structure layer 50. Sintered particles 56 are scaled to a visible size in FIG. 2, but could be microscopic in size in application. Vapor cavity 52 is an empty space held in frame 40 below wick structure layer 50 and the bottom side of heat spreader 30 (which is capable of being attached to heat sink 32, as seen in FIG. 1A). Vapor chamber 44 also contains working fluid 54. Working fluid 54 flows between wick structure layer 50 and vapor cavity 52, and is capable of transforming between a liquid state and a vapor state as it is heated and cooled. Working fluid 54 forms liquid meniscus curvature 58 around sintered particles 56 along the bottom of wick structure layer 50 when it is in liquid form in wick structure layer 50. Liquid meniscus curvature 58 is scaled to a visible size in FIG. 2, but could be microscopic in size in application.

Working fluid 54 is initially in a liquid state when it is held in wick structure layer 50. As heat is transferred into wick structure layer 50 from conductivity layer 42, working fluid 54 will be heated and will vaporize. Vaporized working fluid 54 will then flow out of wick structure layer 50 to vapor cavity 52. As the vaporized working fluid 54 reaches a bottom side of vapor cavity 52 it will contact heat sink 32 (as seen in FIG. 1A). The heat will then transfer out of working fluid 54 and into heat sink 32, which will cause working fluid 54 to condense back to liquid form. Liquid working fluid 54 can then move towards frame 40, as indicated by flow path A in FIG. 2. When liquid working fluid 54 reaches frame 40, it will be transported up the sides of frame 40 into wick structure layer 50, as indicated by flow paths B located on either side of vapor cavity 52 along frame 40. Working fluid 54 moves towards frame 40 and up into wick structure layer 50 due to capillary forces. The capillary forces are generated due to liquid meniscus curvature 58 formed in wick structure layer 50. Since the capillary forces are dominant over viscous forces and gravity at small length scales, the liquid wicking action from heat sink 32 to electronic device 22 is nearly independent of the device orientation.

The use of vapor chamber 44 in heat spreader 32 is advantageous, as it increases the amount of heat that can be transferred from conductivity layer 42 to heat sink 32. Working fluid 54 can efficiently transfer heat through vapor chamber 44, which increases the reliability of cooling system 20. Further, using vapor chamber 44 in cooling system 20 reduces the number of other components required to transfer heat through the cooling system, which reduces the cost, size, and manufacturing difficulties present with prior art systems. Additionally, vapor chamber 44 is advantageous, as it can increase heat transfer through cooling system 20 regardless of the orientation of cooling system 20, as it is nearly independent of acceleration and gravitational forces.

Figure 3:
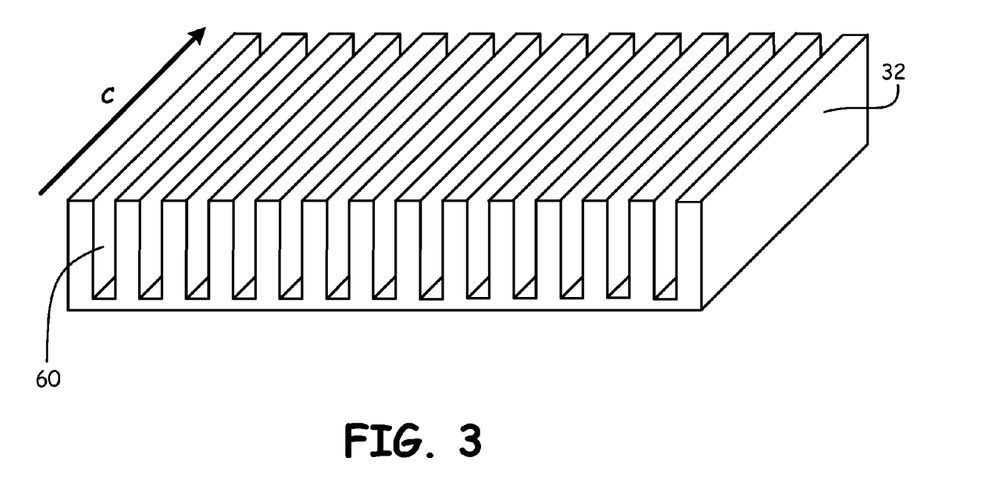
FIG. 3 is a perspective cross-sectional view of a heat sink portion of the cooling system seen in FIG. 1A, taken along line 3-3 of FIG. 1A.

FIG. 3 is a perspective cross-sectional view of heat sink 32 of cooling system 20, taken along line 3-3 of FIG. 1A. Heat sink 32 includes a plurality of microchannels 60. Heat sink 32 is made out of a ceramic material in the embodiment shown, but can be constructed out of any suitable material in alternate embodiments.

As seen in FIG. 3, microchannels 60 run through heat sink 32 and extend from a first side of heat sink 32 to a second side of heat sink 32. In the embodiment shown, microchannels 60 are rectangular shaped and have a width between 0.05 millimeters (0.002 inches) and 5.0 millimeters (0.197 inches). In alternate embodiments, microchannels 60 can be made any shape (including circular, triangular, or trapezoidal shaped) and any size that is capable of transferring heat from heat spreader 30 to an ambient. The number of microchannels 60 running through heat sink 32 will depend on the size of heat sink 32 and the size of microchannels 60. The configuration and arrangement of microchannels 60 in heat sink 32 can vary depending on the construction and use of cooling system 20.

As heat is transferred through cooling system 20, the heat will dissipate through heat sink 32 and into microchannels 60. Microchannels 60 include a heat transfer substance such as a refrigerant, water, or dielectric liquid. These materials include both two-phase change materials, that vaporize when they are heated and condense when they are cooled, and single-phase materials in either liquid or vapor form. In the embodiment shown, microchannels 60 include a two-phase change refrigerant. The refrigerant will begin to be heated when it enters microchannels 60 at the first side of heat sink 32. The refrigerant will then flow through microchannels 60, as indicated by arrow C. As the refrigerant flows through microchannels 60, it will be vaporized as it absorbs heat being transferred into heat sink 32 from heat spreader 30. The refrigerant will then exit heat sink 32 at the second end of heat sink 32, which will transfer heat out of heat sink 32 and cooling system 20.

Utilizing heat sink 32 with microchannels 60 is advantageous, as it increases the amount of heat that can be reliably transferred through heat sink 32. This increases the effectiveness and reliability of cooling system 20 overall.

Figure 4:
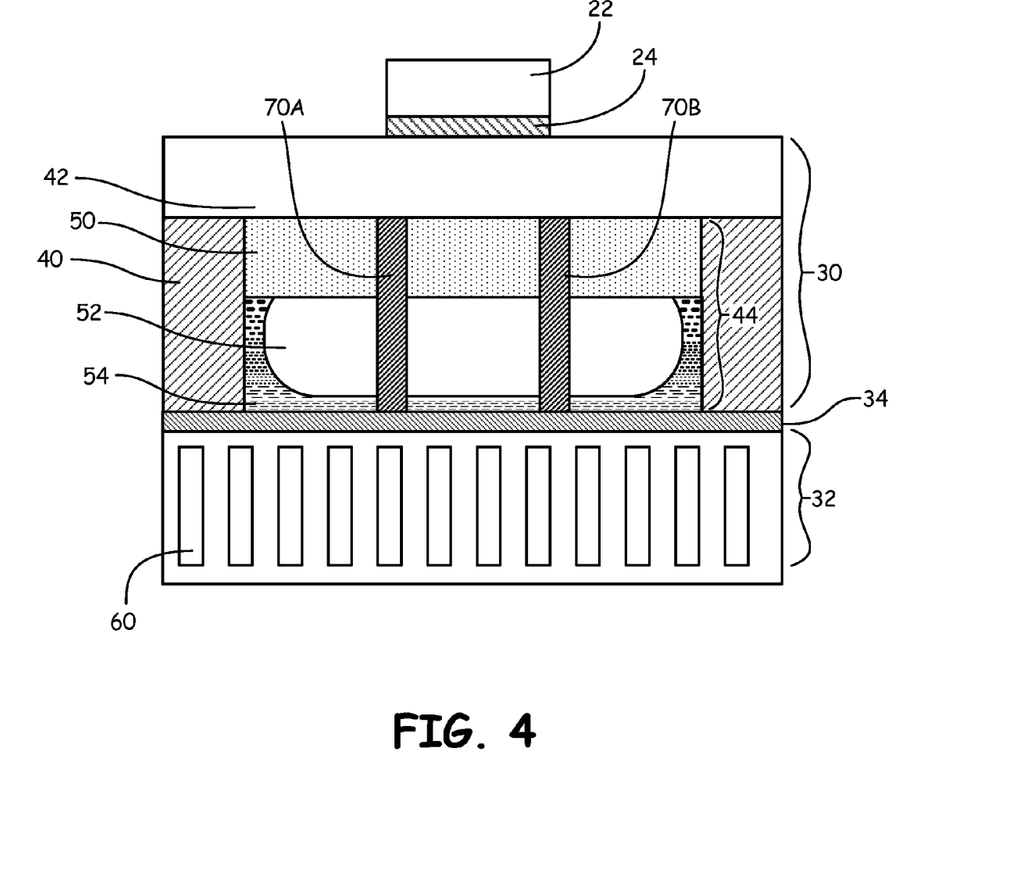
FIG. 4 is a front cross-sectional view of the cooling system of FIG. 1A showing support posts in the cooling system.

FIG. 4 is a front cross-sectional view of cooling system 20 showing support posts 70A and 70B in cooling system 20. Cooling system 20 includes electronic device 22, interface layer 24, heat spreader 30, heat sink 32, connecting layer 34, and support posts 70A and 70B. Heat spreader 30 includes frame 40, conductivity layer 42, and vapor chamber 44. Vapor chamber 44 includes wick structure layer 50, vapor cavity 52, and working fluid 54. Heat sink 32 includes microchannels 60.

As described above, cooling system 20 includes electronic device 22 attached to heat spreader 30 with interface layer 24. Heat spreader 30 is then attached to heat sink 32 with connecting layer 34. Heat spreader 30 includes conductivity layer 42 at a top end. A bottom side of conductivity layer 42 is attached to a top side of frame 40 and vapor chamber 44. Vapor chamber 44 is held inside frame 40. Vapor chamber 44 includes wick structure layer 50 at a top end and vapor cavity 52 at a bottom end. Working fluid 54 is held in vapor chamber 44, and moves between wick structure layer 50 and vapor cavity 52.

Support posts 70A and 70B are held in heat spreader 30 and run through vapor chamber 44. A top side of support posts 70A and 70B are attached to a bottom side of conductivity layer 42. A bottom side of support posts 70A and 70B are attached to a top side of connecting layer 34. Support posts 70A and 70B can be located at any position in vapor chamber 44 that allows them to support vapor chamber 44. In the embodiment shown, support posts 70A and 70B are located beneath electronic device 22.

Support posts 70A and 70B help to ensure that vapor chamber 44 is functioning properly. Vapor chamber 44 needs to be supported so that no portion collapses or otherwise fails. During operation when high temperatures are being put on cooling system 20, vapor cavity 52 has a pressure that puts mechanical stress on cooling system 20. Support posts 70A and 70B are used to ensure that cooling system 20 and vapor chamber 44 maintain mechanical integrity. If a portion of vapor chamber 44 were to collapse, the entire structure would be compromised, as the capillary forces that move working fluid 54 through vapor chamber 44 depend on the size and structure of vapor chamber 44. If the capillary forces were changed due to a collapse or failure of vapor chamber 44, working fluid 54 may not be able to travel between wick structure layer 50 and vapor cavity 52, which would affect the overall function of vapor chamber 44. Thus, support posts 70A and 70B are advantageous, as they can help to ensure that vapor chamber 44 is functioning properly.

Figure 5:
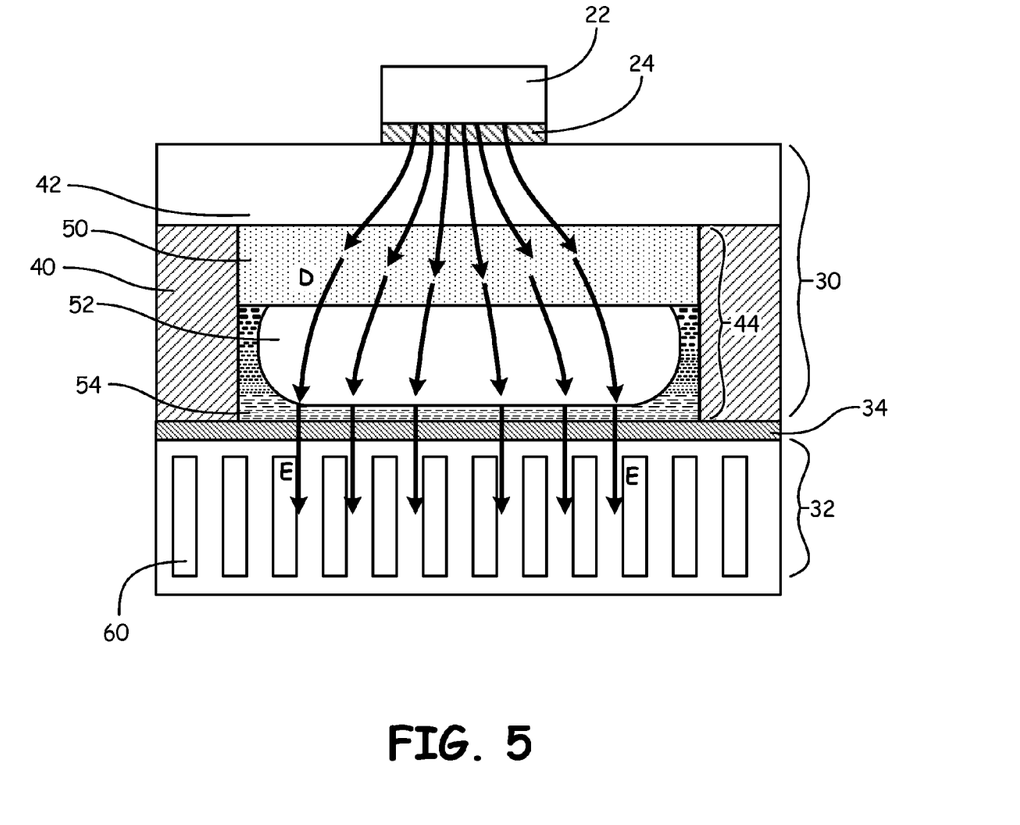
FIG. 5 is a front cross-sectional view of the cooling system of FIG. 1A showing the heat transfer through the cooling system.

FIG. 5 is a front cross-sectional view of cooling system 20 showing how heat is transferred through cooling system 20. Cooling system 20 includes electronic device 22, interface layer 24, heat spreader 30, heat sink 32, and connecting layer 34. Heat spreader 30 includes frame 40, conductivity layer 42, and vapor chamber 44. Vapor chamber 44 includes wick structure layer 50, vapor cavity 52, and working fluid 54. Heat sink 32 includes microchannels 60.

Heat is produced by electronic device 22 and transferred through interface layer 24 to heat spreader 30. As the heat is first transferred into heat spreader 30 it will pass through conductivity layer 42 and then through vapor chamber 44. Conductivity layer 42 and vapor chamber 44 will spread the heat through heat spreader 30, as seen by arrows D in FIG. 5. Spreading the heat through conductivity layer 42 and vapor chamber 44 is advantageous, as it will improve the overall effectiveness of cooling system 20. The heat will initially be spread through conductivity layer 42. As the heat reaches the bottom of conductivity layer 42, the heat will be transferred to wick structure layer 50 in vapor chamber 44. The heat will cause working fluid 54 that is held in wick structure layer 50 to vaporize, and the vaporized and heated working fluid 54 will then move out of wick structure layer 50 to vapor cavity 52. Working fluid 52 will moves downwards through vapor chamber 44 until it reaches connecting layer 34 and heat sink 32, as indicated by arrows D. As vaporized working fluid 54 reaches heat sink 32, it will condense and the heat that was being carried by vaporized working fluid 54 will be transferred into heat sink 32, as indicated by arrows E. This process of heat transfer from heat spreader 30 to connecting layer 34 will provide very small heat spreading resistance and a uniform heat flux rejection area in connecting layer 34. By rejecting the heat flux uniformly in connecting layer 34, heat sink 32 is utilized more effectively. Heat sink 32 contains microchannels 60. As the heat moves through heat sink 32, it will transfer into microchannels 60. Microchannels 60 contain a heat transfer substance (for example a refrigerant) that picks up the heat that is transferred into heat sink 32 from heat spreader 30. The substance in microchannels 60 will flow from a first end of heat sink 32 to a second end of heat sink 32. In the embodiment shown, the substance in microchannels 60 is a two-phase change refrigerant. As the refrigerant flows through microchannels 60 it will be vaporized by the heat being transferred into heat sink 32 from heat spreader 30. Some of the heat will exit cooling system 20 when the refrigerant held in microchannels 60 exits heat sink 32. Heat remaining in cooling system 20 after it has passed through microchannels 60 can then transfer through a bottom side of heat sink 32 into an ambient surrounding heat sink 32.

Cooling system 20 increases the amount of heat that can be transferred through cooling system 20 for a given temperature difference by utilizing vapor chamber 44 and microchannels 60. Using vapor chamber 44 and microchannels 60 also increases the reliability of cooling system 20 by reducing the number of components that need to be used in cooling system 20 to effectively transfer heat from electronic device 22 to an ambient. The reduction in the number of components required also simplifies the manufacturing process and reduces the cost of constructing cooling system 20. The reduced number of components used by cooling system 20 also reduces the number of interface layers that are required to hold cooling system 20 together. Reducing the number of interface layers that are used increases the effectiveness of cooling system 20 by reducing the thermal resistances between the components in cooling system 20.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:
1. A system comprising:
    an electronic device;
    a heat spreader with a vapor chamber attached to a bottom end of the electronic device, so that heat flows from the electronic device to the heat spreader, wherein the heat spreader comprises:
        a conductivity layer held at a top end of the heat spreader;
        a frame attached to a bottom side of the conductivity layer; and
        a vapor chamber in the frame that contains a working fluid that is capable of phase-change heat transfer; and
    a heat sink with microchannels running through it attached to a bottom end of the heat spreader, so that heat from the heat spreader flows to the heat sink, wherein the microchannels contain a working fluid that is capable of phase-change heat transfer.
2. The cooling system of claim 1, wherein the heat sink is made out of aluminum nitride.
3. The cooling system of claim 1, wherein the heat sink is made out of silicon nitride.
4. The cooling system of claim 1, wherein the microchannels running through the heat sink have a width between about 0.05 millimeters (0.002 inches) and 5.0 millimeters (0.197 inches).
5. The cooling system of claim 1, wherein the working fluid in the microchannels is a refrigerant that vaporizes when heated and condenses when cooled.
6. The cooling system of claim 1, wherein the vapor chamber further comprises:
    a wick structure layer held inside the frame at a top end; and
    a vapor cavity held inside the frame below the wick structure layer;
    wherein the working fluid is contained in the vapor cavity and the wick structure layer.
7. The cooling system of claim 6, wherein the frame is attached to the heat sink with a brazed layer of copper.
8. The cooling system of claim 6, wherein the wick structure layer is made out of a material selected from the group consisting of sintered copper, copper mesh, and combinations thereof.
9. The cooling system of claim 6, wherein the working fluid in the vapor chamber is water.
10. The cooling system of claim 6, wherein the conductivity layer is made out of a copper-molybdenum-copper structure.
11. A cooling system for a device, the cooling system comprising:
    a conductivity layer;
    a frame attached to a bottom side of the conductivity layer;
    a wick structure layer held inside the frame at a top end;
    a vapor cavity held inside the frame below the wick structure layer;
    a working fluid held inside the frame and moving between the vapor cavity and the wick structure layer, wherein the working fluid is capable of phase-change heat transfer; and a heat sink with microchannels running through it attached to a bottom side of the frame, wherein the microchannels contain a working fluid that is capable of phase-change heat transfer.

12. The cooling system of claim 11, and further comprising:
a device attached to the cooling system.

13. The cooling system of claim 11, wherein the working fluid in the frame flows in a loop from the vapor cavity to the wick structure layer and back to the vapor cavity.

14. The cooling system of claim 11, wherein the working fluid in the microchannels is a refrigerant that vaporizes when heated and condenses when cooled, to increase the amount of heat that can be dissipated through the microchannels.

15. A method for cooling a device, the method comprising:
transferring heat generated by a device through a conductivity layer;
spreading the heat through a heat spreader using a working fluid contained in the heat spreader that is capable of phase-change heat transfer;
transferring the heat from the heat spreader to a heat sink that contains microchannels;
transferring the heat through the microchannels in the heat sink using a working fluid that is contained in the microchannels and that is capable of phase-change heat transfer; and
releasing the heat from the heat sink into an ambient.

16. The method of claim 15, wherein the heat spreader comprises a wick structure layer, a vapor cavity, and the working fluid, where the working fluid flows between the vapor cavity and the wick structure layer.

17. The method of claim 16, wherein the heat is absorbed by the working fluid in the wick structure layer and flows to the vapor cavity so that the heat can be transferred to the heat sink.

18. The method of claim 15, wherein the working fluid in the microchannels is a refrigerant that vaporizes when heated and condenses when cooled.

19. The method of claim 18, wherein the refrigerant flows from a first side of the heat sink to a second side of the heat sink through the microchannels.

20. A cooling system for a device, the cooling system comprising:
a conductivity layer;
a frame attached to a bottom side of the conductivity layer;
a wick structure layer held inside the frame at a top end;
a vapor cavity held inside the frame below the wick structure layer;
a working fluid held inside the frame and moving between the vapor cavity and the wick structure layer;
a plurality of support posts running through the wick structure layer and the vapor cavity; and
a heat sink with microchannels running through it attached to a bottom side of the frame.

* * * * *